(12) United States Patent
Chen et al.

(10) Patent No.: US 10,096,503 B2
(45) Date of Patent: Oct. 9, 2018

(54) STOPPER FOR SUBSTRATE CASSETTE AND SUBSTRATE CASSETTE ASSEMBLY

(71) Applicants: BOE TECHNOLOGY GROUP CO., LTD., Beijing (CN); BEIJING BOE DISPLAY TECHNOLOGY CO., LTD., Beijing (CN)

(72) Inventors: Yulong Chen, Beijing (CN); Xuesong Gao, Beijing (CN); Lele Xu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 91 days.

(21) Appl. No.: 14/803,922

(22) Filed: Jul. 20, 2015

(65) Prior Publication Data

US 2016/0211159 A1    Jul. 21, 2016

(30) Foreign Application Priority Data

Jan. 20, 2015 (CN) .......................... 2015 1 0028661

(51) Int. Cl.
   *H01L 21/673* (2006.01)
(52) U.S. Cl.
   CPC .... *H01L 21/67343* (2013.01); *H01L 21/6732* (2013.01); *H01L 21/6734* (2013.01); *H01L 21/67323* (2013.01)
(58) Field of Classification Search
   CPC ........... H01L 21/67343; H01L 21/6734; H01L 21/67323; H01L 21/6732

(Continued)

(56) References Cited

U.S. PATENT DOCUMENTS 3,232,440 A * 2/1966 Lyszczek ............. B65G 49/062
                                                    211/41.14
3,682,083 A * 8/1972 Puente ................... G03D 13/08
                                                    118/500

(Continued)

FOREIGN PATENT DOCUMENTS

CN         2721562 Y      8/2005
CN       201140867 Y     10/2008

(Continued)

OTHER PUBLICATIONS

Office Action dated May 3, 2016 issued in corresponding Chinese Application No. 201510028661.X.

(Continued)

*Primary Examiner* — Stanton L Krycinski
(74) *Attorney, Agent, or Firm* — Nath, Goldberg & Meyer; Joshua B. Goldberg; Scott H. Blackman

(57) ABSTRACT

The present invention provides a stopper for a substrate cassette and a substrate cassette assembly, belonging to the technical field of manufacturing of display devices, which can solve the problem that an existing substrate cassette easily damages a substrate. The stopper for the substrate cassette of the present invention is strip-shaped, and arranged, in a length direction, on an inner side of a mullion of the substrate cassette; the stopper has a contact surface configured to contact the mullion of the substrate cassette and an exposed surface opposite to the contact surface, and the exposed surface, at least on a side facing the outside of the substrate cassette, is a convex cambered surface.

20 Claims, 2 Drawing Sheets

(58) Field of Classification Search
USPC .......................................... 211/41.14, 41.18
See application file for complete search history.

(56) References Cited

U.S. PATENT DOCUMENTS

| | | | | |
|---|---|---|---|---|
| 4,930,634 A * | 6/1990 | Williams | .......... | H01L 21/67343 206/454 |
| 5,351,836 A * | 10/1994 | Mori | .......... | B65D 25/107 118/500 |
| 5,584,401 A * | 12/1996 | Yoshida | .......... | H01L 21/6734 118/500 |
| 5,638,958 A * | 6/1997 | Sanchez | .......... | H01L 21/6732 118/500 |
| 5,730,574 A * | 3/1998 | Adachi | .......... | H01L 21/67236 414/225.01 |
| 5,785,186 A * | 7/1998 | Babbs | .......... | H01L 21/67294 206/454 |
| 5,853,214 A * | 12/1998 | Babbs | .......... | H01L 21/6734 206/711 |
| 5,890,598 A * | 4/1999 | Hayashida | .......... | H01L 21/6734 206/454 |
| 6,186,344 B1 * | 2/2001 | Park | .......... | H01L 21/6734 211/41.1 |
| 6,523,701 B1 * | 2/2003 | Yoshida | .......... | H01L 21/67343 206/454 |
| 7,017,896 B2 * | 3/2006 | Sa | .......... | H01L 21/6734 269/55 |
| 7,086,540 B2 * | 8/2006 | Huang | .......... | H01L 21/6734 211/183 |
| 7,124,494 B2 * | 10/2006 | Sa | .......... | H01L 21/6734 269/55 |
| 7,188,736 B2 * | 3/2007 | Choi | .......... | B65G 49/062 206/454 |
| 7,232,037 B2 * | 6/2007 | Jang | .......... | H01L 21/6734 211/41.14 |
| 7,331,103 B2 * | 2/2008 | Kakita | .......... | H01L 21/67333 29/426.3 |
| 8,528,750 B2 * | 9/2013 | Heo | .......... | H01L 21/6734 206/710 |
| 8,657,125 B2 * | 2/2014 | Hsieh | .......... | B08B 11/02 206/707 |
| 8,733,547 B2 * | 5/2014 | Nam | .......... | H01L 21/6734 206/454 |
| 8,905,239 B2 * | 12/2014 | Kim | .......... | H01L 21/6735 206/454 |
| 9,117,864 B2 * | 8/2015 | Dejima | .......... | H01L 21/6732 |
| 2003/0066810 A1 * | 4/2003 | Chu | .......... | H01L 21/6732 211/41.18 |
| 2004/0069727 A1 * | 4/2004 | Huang | .......... | G11B 33/0444 211/41.1 |
| 2006/0011507 A1 * | 1/2006 | Uchida | .......... | H01L 21/67343 206/711 |
| 2006/0075825 A1 * | 4/2006 | Liu | .......... | H01L 21/6734 73/788 |
| 2006/0226094 A1 * | 10/2006 | Cho | .......... | B65D 85/48 211/41.18 |
| 2007/0062889 A1 * | 3/2007 | Salzmann | .......... | G11B 17/225 211/41.18 |
| 2008/0003082 A1 * | 1/2008 | Motoshima | .......... | H01L 21/6734 414/217.1 |
| 2010/0224524 A1 * | 9/2010 | Yuasa | .......... | H01L 21/6734 206/454 |
| 2014/0231305 A1 * | 8/2014 | Dejima | .......... | H01L 21/6732 206/711 |

FOREIGN PATENT DOCUMENTS

| | | | | |
|---|---|---|---|---|
| CN | 101659341 A | 3/2010 | | |
| CN | 201673895 U | 12/2010 | | |
| CN | 103662454 A | 3/2014 | | |
| JP | H09240777 A | 9/1997 | | |
| JP | H10203584 A | 8/1998 | | |
| WO | WO 2005035147 A1 * | 4/2005 | ............ | B08B 11/02 |
| WO | WO 2012127123 A1 * | 9/2012 | ......... | H01L 21/6732 |

OTHER PUBLICATIONS

Office action dated Nov. 21, 2016 of corresponding CN 201510028661.X, with English translation.

* cited by examiner

STOPPER FOR SUBSTRATE CASSETTE AND SUBSTRATE CASSETTE ASSEMBLY

FIELD OF THE INVENTION

The present invention belongs to the technical field of manufacturing of display devices, in particular to a stopper for a substrate cassette and a substrate cassette assembly.

BACKGROUND OF THE INVENTION

In the manufacturing process of liquid crystal display devices, organic light emitting diode (OLED) display devices and the like, substrates are often transferred among different processing equipments. As the substrates are very thin and thus may be damaged easily, they can not be carried directly. Instead, the substrates are placed into a special "substrate cassette" for transportation.

As shown in FIG. 1, a substrate cassette 1 includes a multi-layered framework, on each layer of which, one substrate 9 is placed, and mullions 11 are longitudinally arranged on both sides of the framework. Normally, there should be a gap of several millimeters between each of the both sides of the substrate 9 and each of the mullions 11 respectively. However, duo to the displacement of equipment or other reasons, the relative positions of the substrate 9 and the substrate cassette 1 may not be correct. As a result, the substrate 9 is likely to collide with an inner side (i.e., a side facing a space for housing the substrate 9) of each of the millions 11. As the substrate cassette 1 is usually made of metal and thus has a high hardness, the substrate 9 is easily damaged when it collides with the mullions 11.

SUMMARY OF THE INVENTION

The present invention provides, in view of a problem that an existing substrate cassette damages the substrate easily, a stopper for a substrate cassette and a substrate cassette assembly, which may avoid damaging the substrate.

The present invention employs the following technical solution to solve the technical problem: a stopper for a substrate cassette is provided, wherein the stopper is strip-shaped, and is arranged on an inner side of a mullion of the substrate cassette in a length direction; and the stopper has a contact surface configured to contact the mullion of the substrate cassette and an exposed surface opposite to the contact surface, and the exposed surface, at least on a side facing the outside of the substrate cassette, is a convex cambered surface.

Both sides of the exposed surface are convex cambered surfaces.

The stopper may further include: a connecting structure configured to connect with the mullion of the substrate cassette.

The connecting structure may include a plurality of through holes configured to provide bolts therein.

The connecting structure may include a clamping structure configured to buckle with the mullion of the substrate cassette.

The stopper may be made of plastic.

The plastic may include polypropylene.

The present invention employs the following technical solution to solve the technical problem: a substrate cassette assembly is provided, and includes:

a substrate cassette, including a multi-layered framework for carrying a substrate, the framework includes a mullion; and the stopper arranged on an inner side of the mullion of the substrate cassette.

The stopper of the present invention is arranged on the inner side of the mullion of the substrate cassette, so if the position of the substrate is not appropriate, the substrate will collide with the stopper rather than the mullion made of metal, thus avoiding damaging the substrate; meanwhile, the exposed surface, at least on a side facing the outside of the substrate cassette, of the substrate is a convex cambered surface, so if the substrate, when it is placed into the substrate cassette, is not aligned in position, the substrate will collide with the convex cambered surface and slip into the substrate cassette along the convex cambered surface without being damaged.

REFERENCE NUMERALS

1: substrate cassette;
11: mullion;
2: stopper;
21: contact surface;
22: exposed surface;
29: through hole; and
9: substrate.

DETAILED DESCRIPTION OF THE EMBODIMENTS

To make those skilled in the art understand the technical solutions of the present invention better, the present invention will be further described below in detail with reference to the accompanying drawings by specific implementations.

Figure 1:
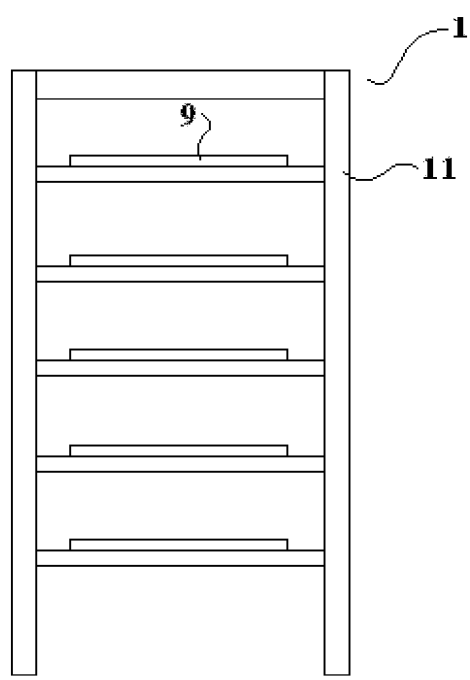
FIG. 1 is a structural diagram of an existing substrate cassette.
Figure 2:
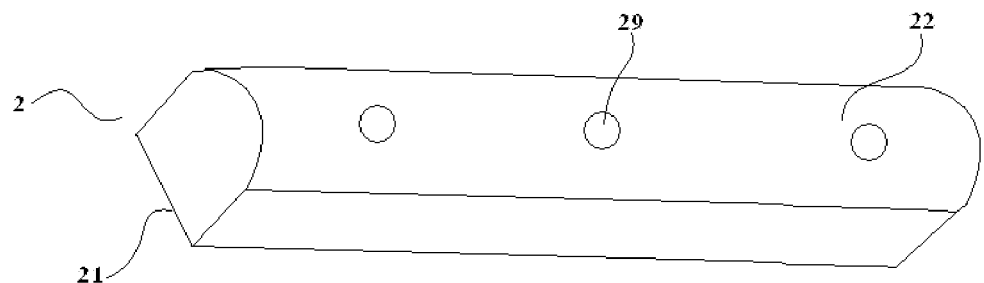
FIG. 2 is a structural diagram of a stopper for a substrate cassette according to an embodiment of the present invention.
Figure 3:
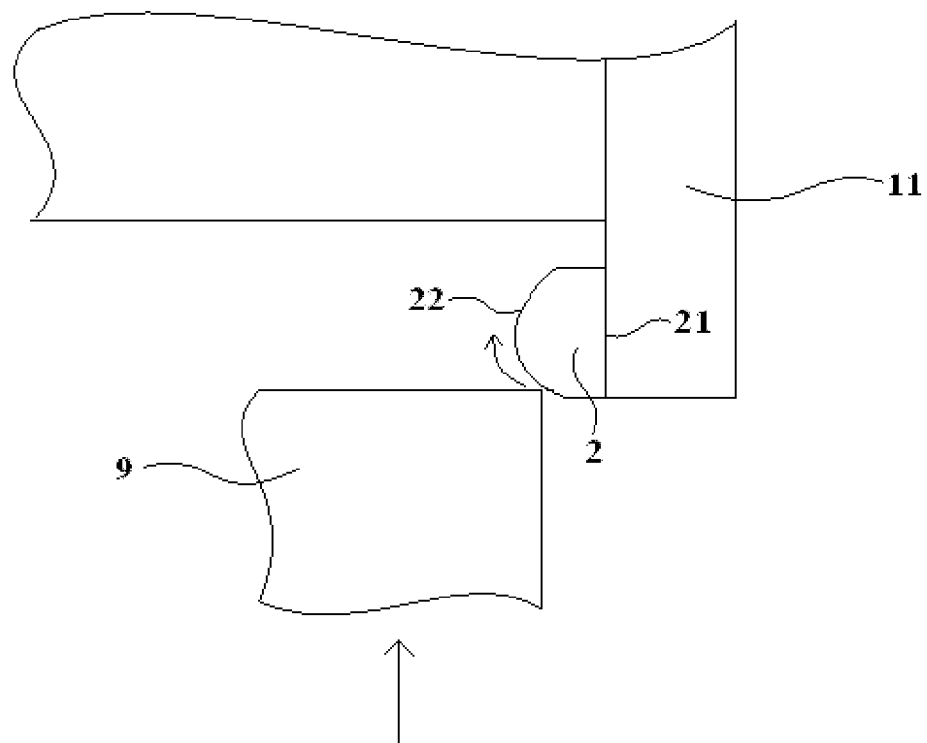
FIG. 3 is a schematic block diagram of the working principle of the stopper for a substrate cassette according to the embodiment of the present invention.
Figure 4:
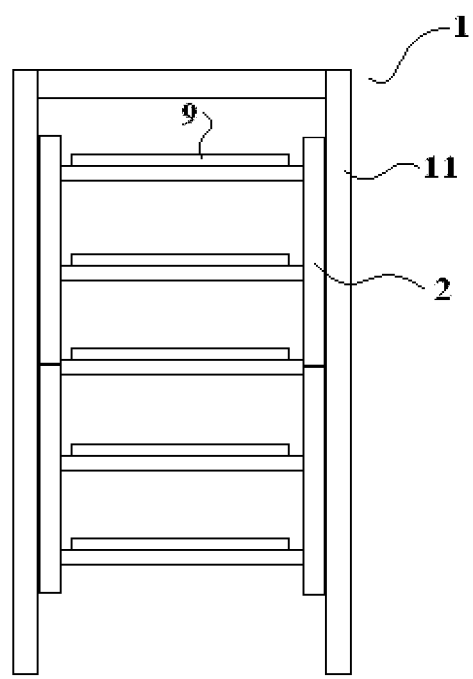
FIG. 4 is a structural diagram of a substrate cassette assembly according to the embodiment of the present invention.

Embodiment 1:

As shown in FIG. 2 to FIG. 4, this embodiment provides a stopper 2 for a substrate cassette, which is strip-shaped, and arranged, in a length direction, on an inner side of a mullion 11 of the substrate cassette 1. The length direction is a length direction of the mullion 11. The stopper 2 is arranged on the inner side of the mullion 11, so that the length direction of the stopper 2 is parallel to or substantially parallel to the length direction of the mullion 11.

The stopper 2 of this embodiment may be arranged on the inner side (a side facing a space for housing a substrate 9) of the mullion 11 of the substrate cassette 1, that is, the stopper 2 may be attached onto the inner side of the mullion 11 of the substrate cassette 1. The stopper 2 may be formed of flexible and elastic material, so the substrate 9, when its position is not appropriate, will collide with the stopper 2 rather than directly colliding with the mullion 11, thus avoiding damaging the substrate 9.

The stopper 2 has a contact surface 21 configured to contact the mullion 11 of the substrate cassette 1 and an exposed surface 22 opposite to the contact surface 21, and the exposed surface 22, at least on a side facing the outside of the substrate cassette 1, is a convex cambered surface.

In other words, as shown in FIG. 2, one surface (the contact surface 21) of the stopper 2 is configured to contact the mullion 11, and a surface (the exposed surface 22), opposite to the contact surface 21, thereof is of course exposed. At least one of both sides of the exposed surface 22 is a smooth convex cambered surface, and during mounting, this side faces the outside of the substrate cassette 1. In this way, as shown in FIG. 3, when the substrate 9 is placed into the substrate cassette 1, if the position of the substrate 9 is not appropriate, the substrate 9 will collide with the convex cambered surface and slide along the convex cambered surface and finally enter into the substrate cassette 1, smoothly. Hence, the substrate 9 will not collide with the mullion 11, thus avoiding damaging the substrate 9. The reason why the side, facing the outside of the substrate cassette 1, of the exposed surface 22 is required to be a convex cambered surface is that if the substrate 9 collides with the convex cambered surface when it enters the substrate cassette, position and angle of the placed substrate 9 should have been adjusted correctly, and the substrate 9, when it is taken out, generally will not collide with the other side of the stopper 2 once again.

Preferably, both sides of the exposed surface 22 are convex cambered surfaces.

In other words, the side of the exposed surface 22, preferably facing the outside of the substrate cassette 1, is also a convex cambered surface, or in other words, the exposed surface 22 is preferably an overall convex cambered surface with a protruded middle part. In this way, it is not necessary to distinguish both sides of the exposed surface 22 from each other when the stopper 2 is mounted, this is very convenient; meanwhile, if the substrate 9, when it is taken out, collides with one side of the stopper 2 for some reasons, the substrate 9 may slide out smoothly as this side of the stopper 2 is also a convex cambered surface.

Preferably, the stopper 2 further includes a connecting structure configured to connect with the mullion 11 of the substrate cassette 1 and to connect the stopper 2 with the substrate cassette 1. Of course, it is also feasible that the stopper 2 is connected onto the mullion 11 by bonding, soldering and other ways.

Preferably, as one example of the embodiment, the connecting structure may include a plurality of through holes 29 configured to provide bolts therein.

In other words, a plurality of through holes 29 may be formed in the stopper 2, and a plurality of through holes are also provided at corresponding positions on the mullion 11 of the substrate cassette 1. In this way, the stopper 2 may be fixed onto the mullion 11 just by passing the bolts through the through holes 29 on the stopper 2 and the corresponding through holes on the mullion 11 and fixing the bolts by nuts. Such a connecting structure is convenient for mounting and dismounting, firm in connection and simple in structure. As shown in FIG. 2, three through holes 29 may be preferably formed on each stopper 2 and those through holes 29 are preferably distributed in the length direction of the stopper 2 uniformly.

Preferably, as an example of the embodiment, the connecting structure may include a clamping structure configured to buckle with the mullion 11 of the substrate cassette 1.

In other words, the connecting structure may be of a clamping form. For example, the stopper 2 may have a protruded clamp; and a bayonet, fitted with the clamp, is arranged on the mullion 11 of the substrate cassette 1. The connection of the stopper 2 with the mullion 11 may be realized by inserting the clamp into the bayonet.

Preferably, the stopper 2 is made of plastic, more preferably, polypropylene (PP).

Manufacturing the stopper 2 by plastic can better avoid damaging the substrate 9 as the hardness of plastic is significantly lower than that of metal. In addition to low hardness, the polypropylene materials have a significant self-lubricating effect. Therefore, the substrate 9, when collides with the stopper 2, may slide away more easily, thus avoiding being damaged.

As shown in FIG. 4, a substrate cassette assembly is provided in the embodiment, and includes:

a substrate cassette 1, including a multi-layered framework for carrying a substrate 9, the framework includes a mullion 11; and the stopper 2 arranged on an inner side of the mullion 11 of the substrate cassette 1.

In the substrate cassette assembly of this embodiment, the substrate cassette 1 includes a multi-layered framework, each layer of which is configured to carry one substrate 9, and the framework includes the mullion 11 longitudinally arranged thereon. The stopper 2 is arranged on the inner side (i.e., a side facing a space for housing the substrate 9) of the mullion 11.

Obviously, in the substrate cassette assembly, the stoppers 2 are preferably arranged in mullions 11 on the left and right sides of the substrate cassette 1. Moreover, if the length of a single stopper 2 is less than that of the mullion 11, a plurality of stoppers 2 are preferably arranged on the mullion 11 on each side, so that parts, with which the substrate 9 may collide, on the mullion 11 are covered by the plurality of the stoppers 2.

It may be understood that, the implementations are exemplary implementations merely for describing the principle of the present invention, and the present invention is not limited thereto. For a person of ordinary skill in the art, various variations and improvements may be made without departing from the spirit and essence of the present invention, and those variations and improvements should also be regarded as falling into the protection scope of the present invention.

The invention claimed is:

1. A stopper for a substrate cassette, the substrate cassette includes a multi-layered framework, one substrate is placed on a supporting plate disposed in each layer of the multi-layered framework, and left and right ends of the supporting plate disposed in each layer of the multi-layered framework are respectively fixed to two mullions longitudinally arranged on both sides of the framework, wherein, the stopper is strip-shaped, is spaced apart from the multi-layered framework, and is arranged on an inner side of one mullion of the two mullions in a length direction, wherein the length direction is a length direction of the mullion so that the length direction of the stopper is parallel to or substantially parallel to the length direction of the mullion; and the stopper has a contact surface configured to contact the mullion of the substrate cassette and an exposed surface opposite to the contact surface, and the exposed surface, at least on a side facing the outside of the substrate cassette, is a convex cambered surface that is configured to collide with the substrate, if the substrate is not in an appropriate position while being placed into the substrate cassette, causing the substrate to slide along the convex cambered surface and enter into the substrate cassette without colliding with the mullion.

2. The stopper according to claim 1, wherein, a side of the exposed surface facing the inside of the substrate cassette is a convex cambered surface.

3. The stopper according to claim 1, further comprising: a connecting structure configured to connect with the mullion of the substrate cassette.

4. The stopper according to claim 3, wherein the connecting structure comprises a plurality of through holes configured to provide bolts therein, or comprises a clamping structure configured to buckle with the mullion of the substrate cassette.

5. The stopper according to claim 1, wherein the stopper is made of plastic.

6. The stopper according to claim 2, wherein the stopper is made of plastic.

7. The stopper according to claim 3, wherein the stopper is made of plastic.

8. The stopper according to claim 4, wherein the stopper is made of plastic.

9. The stopper according to claim 5, wherein the plastic comprises polypropylene.

10. The stopper according to claim 6, wherein the plastic comprises polypropylene.

11. The stopper according to claim 7, wherein the plastic comprises polypropylene.

12. The stopper according to claim 8, wherein the plastic comprises polypropylene.

13. A substrate cassette assembly, comprising:
a substrate cassette, comprising a multi-layered framework for carrying a substrate, wherein one substrate is placed on a supporting plate disposed in each layer of the multi-layered framework, and left and right ends of the supporting plate disposed in each layer of the multi-layered framework are respectively fixed to two mullions longitudinally arranged on both sides of the framework; and
a stopper that is strip-shaped, is spaced apart from the multi-layered framework, and is arranged on an inner side of one mullion of the two mullions in a length direction, wherein the length direction is a length direction of the mullion so that the length direction of the stopper is parallel to or substantially parallel to the length direction of the mullion; and
the stopper has a contact surface configured to contact the mullion of the substrate cassette and an exposed surface opposite to the contact surface, and the exposed surface, at least on a side facing the outside of the substrate cassette, is a convex cambered surface that is configured to collide with the substrate, if the substrate is not in an appropriate position while being placed into the substrate cassette, causing the substrate to slide along the convex cambered surface and enter into the substrate cassette without colliding with the mullion.

14. The substrate cassette assembly according to claim 13, wherein
a side of the exposed surface facing the inside of the substrate cassette is a convex cambered surface.

15. The substrate cassette assembly according to claim 13, wherein the stopper further comprises:
a connecting structure configured to connect with the mullion of the substrate cassette.

16. The substrate cassette assembly according to claim 15, wherein
the connecting structure comprises a plurality of through holes configured to provide bolts therein, or comprises a clamping structure configured to buckle with the mullion of the substrate cassette.

17. The substrate cassette assembly according to claim 13, wherein
the stopper is made of plastic.

18. The substrate cassette assembly according to claim 14, wherein
the stopper is made of plastic.

19. The substrate cassette assembly according to claim 15, wherein
the stopper is made of plastic.

20. The substrate cassette assembly according to claim 16, wherein
the stopper is made of plastic.

* * * * *